(12) United States Patent
Gu et al.

(10) Patent No.: US 11,881,700 B2
(45) Date of Patent: Jan. 23, 2024

(54) LONGITUDINAL DIFFERENTIAL PROTECTION METHOD OF TRANSFORMER

(71) Applicants: NR ELECTRIC CO., LTD, Jiangsu (CN); NR ENGINEERING CO., LTD, Jiangso (CN)

(72) Inventors: Qiaogen Gu, Jiangsu (CN); Xiaoyu Zhang, Jiangsu (CN); Jifeng Wen, Jiangsu (CN); Hang Lv, Jiangsu (CN); Pinhao Mo, Jiangsu (CN); Chao Zheng, Jiangsu (CN); Xiao Gong, Jiangsu (CN); Zhongmin Sun, Jiangsu (CN); Xiao Cheng, Jiangsu (CN)

(73) Assignees: NR ELECTRIC CO., LTD., Jiangsu (CN); NR ENGINEERING CO., LTD., Jiangsu (CN)

( * ) Notice: Subject to any disclaimer, the term of this patent is extended or adjusted under 35 U.S.C. 154(b) by 620 days.

(21) Appl. No.: 17/058,378

(22) PCT Filed: May 29, 2019

(86) PCT No.: PCT/CN2019/089067
§ 371 (c)(1),
(2) Date: Nov. 24, 2020

(87) PCT Pub. No.: WO2019/228412
PCT Pub. Date: Dec. 5, 2019

(65) Prior Publication Data
US 2021/0203147 A1    Jul. 1, 2021

(30) Foreign Application Priority Data

May 30, 2018   (CN) .......................... 201810537869.8
May 30, 2018   (CN) .......................... 201810537877.2
May 30, 2018   (CN) .......................... 201810537904.6

(51) Int. Cl.
*H02H 1/00*     (2006.01)
*G01R 31/62*    (2020.01)
*H02H 7/045*    (2006.01)

(52) U.S. Cl.
CPC ........... *H02H 1/0007* (2013.01); *G01R 31/62* (2020.01); *H02H 7/045* (2013.01)

(58) Field of Classification Search
CPC ...... H02H 1/0007; H02H 7/045; H02H 3/006; G01R 31/62
See application file for complete search history.

(56) References Cited

U.S. PATENT DOCUMENTS

| 7,902,854 B2* | 3/2011 | Gunn ....................... G01R 1/22 |
| | | 324/754.01 |
| 2009/0147412 A1* | 6/2009 | Kojovic ............... H02H 7/0455 |
| | | 361/36 |
| 2011/0055423 A1 | 3/2011 | Kobayashi |

FOREIGN PATENT DOCUMENTS

| CN | 101800415 A | 8/2010 |
| CN | 102255284 A * | 11/2011 ............... H02H 7/04 |

(Continued)

OTHER PUBLICATIONS

International Search Report and English Translation for International Application No. PCT/CN2019/089067 dated Aug. 16, 2019.

(Continued)

*Primary Examiner* — Tung S Lau
(74) *Attorney, Agent, or Firm* — Young Basile Hanlon & MacFarlane, P.C.

(57) ABSTRACT

A longitudinal differential protection method for a transformer comprises: calculating a corrected parameter of a transformer according to a voltage and electrical parameters of the transformer, wherein the electrical parameters of the (Continued)

transformer comprise a rated capacity of the transformer, and the corrected parameter of the transformer comprise a capacity of the transformer.

11 Claims, 5 Drawing Sheets

(56) References Cited

FOREIGN PATENT DOCUMENTS

| CN | 102623953 A | 8/2012 |
|---|---|---|
| CN | 103560487 A | 2/2014 |
| CN | 103715930 A | 4/2014 |
| CN | 104065038 A | 9/2014 |
| CN | 2015163005 A | 9/2015 |
| CN | 105552839 A | 5/2016 |
| CN | 106451354 A | 2/2017 |
| CN | 106786633 A | 5/2017 |
| CN | 106953365 A | 7/2017 |
| CN | 206849669 U | 1/2018 |
| CN | 108599105 A | 9/2018 |
| CN | 108599106 A | 9/2018 |
| CN | 108736443 A | 11/2018 |
| JP | 2005269870 A | 9/2005 |
| KR | 100842800 B1 | 7/2008 |
| KR | 20130113504 A | 10/2013 |
| KZ | 22076 A4 | 11/2008 |
| RU | 2502168 C1 | 12/2013 |

OTHER PUBLICATIONS

RU Decision to Grant and English Translation for RU Application No. 2020142585 dated May 29, 2019.
KR Decision to Grant and English Translation for KR Application No. 10-2020-7033579 dated Nov. 3, 2022.
EP Extended Search Report for EP Application No. 19811688.1 dated Jan. 26, 2022.
IEC Guide for the Application, Specification, and Testing of Phase-Shifting Transformers; IEEE Standard, IEEE, Piscataway, NJ, USA, Jul. 16, 2012 (Jul. 16, 2012), pp. 1-44.
CN Supplementary Search and English Translation for CN Application No. 2018105379046 dated Sep. 15, 2019.
CN First Search and English Translation for CN Application No. 2018105379046 dated Feb. 28, 2019.
CN First Office Action and English Translation for CN Application No. 2018105379046 dated Mar. 8, 2019.
CN First Search and English Translation for CN Application No. 2018105378772 dated May 16, 2019.
CN Supplementary Search and English Translation for CN Application No. 2018105378772 dated Mar. 15, 2020.
CN Second Office Action and English Translation for CN Application No. 2018105378772 dated Dec. 2, 2019.
CN First Office Action and English Translation for CN Application No. 2018105378772 dated May 24, 2019.
CN Supplementary Search and English Translation for CN Application No. 2018105378698 dated Dec. 3, 2019.
CN Second Office Action and English Translation for CN Application No. 2018105378698 dated Sep. 27, 2019.
CN First Search and English Translation for CN Application No. 2018105378698 dated Feb. 28, 2019.
CN First Office Action and English Translation for CN Application No. 2018105378698 dated Aug. 3, 2019.

* cited by examiner

LONGITUDINAL DIFFERENTIAL PROTECTION METHOD OF TRANSFORMER

CROSS-REFERENCE TO RELATED APPLICATION(S)

This application is a 371 application of International Application No. PCT/CN2019/089067, filed on May 29, 2019, which claims priority to Chinese Application Nos. 201810537877.2, 201810537869.8, and 201810537904.6, all filed on May 30, 2018, the entire disclosures of all of which are hereby incorporated by reference.

TECHNICAL FIELD

The present invention relates to the field of relay protection of power systems, in particular to a longitudinal differential protection method of a transformer.

BACKGROUND

A conventional secondary rated current calculation method for longitudinal differential protection of a transformer is as follows:

$$\ddot{u}'_{I_{1n}} = \frac{S_n}{\sqrt{3}\,U_{1n}}$$

$$\ddot{u}^{I_{2n}} = \frac{I_{1n}}{N_n}$$

Wherein:

$S_n$ is a nameplate parameter of the transformer: rated capacity; $U_{1n}$ is a nameplate parameter of the transformer: rated line voltage=效效 the $n^{th}$ side; $I_{1n}$ in is a calculated value of a primary rated current of the $n^{th}$ side of the transformer; $N_n$ is a ratio of a current transformer on the $n^{th}$ side of the transformer, $I_{2n}$ is a calculated value of a secondary rated current of the $n^{th}$ side of the transformer.

Compared with common power system transformers, series transformers are applied to different occasions and operate in different working conditions. The invertor of this application found that, at present, the grid-side winding voltage of of a transformer fluctuates drastically in application scenarios such as flexible AC power transmission. When the grid-side voltage of the transformers is too low, the short-circuit current of the transformers is also very low. If this is the case, traditional fault judgment methods for longitudinal differential protection of the transformers have the drawback of insufficient sensitivity, thus failing to meet practical requirements.

When both the circuit where a series transformer is located and the series transformer operates under a light load, the current across the windings of the series transformer is very small, the voltage across the two terminals of the windings of the series transformer is also very small. In this case, the short-circuit current will be extremely small when a minor internal fault happens to the series transformer. A differential current obtained by the conventional secondary rated current calculation method for longitudinal differential protection of a transformer will be very small, and the sensitivity of longitudinal differential protection in reflecting minor internal faults of the series transformer will be reduced.

SUMMARY

A traditional longitudinal differential protection method typically comprises the following steps: acquiring a real-time secondary-side operating parameter of a longitudinal differential protection device; and calculating according to the real-time secondary-side operating parameter and a rated parameter of a transformer to determine whether a malfunction has happened to the transformer.

On the basis of the traditional longitudinal differential protection method, one embodiment of the present application discloses a longitudinal differential protection method of a transformer, which comprises: calculating a corrected parameter of a transformer according to a voltage and an electrical parameters of the transformer, wherein the electrical parameters of the transformer comprises a rated capacity of the transformer, and the corrected parameter of the transformer comprises a capacity of the transformer.

The real-time secondary-side operating parameter of the longitudinal differential protection device and the corrected parameter obtained through the method mentioned above are used to determine whether a malfunction has happened to the transformer.

Optionally, calculating a corrected parameter of a transformer according to a voltage and electrical parameters of the transformer comprises: calculating an adjustment coefficient of the transformer according to the voltage and electrical parameters of the transformer; and calculating the corrected parameter according to the adjustment coefficient and the electrical parameters of the transformer.

Furthermore, the electrical parameters of the transformer comprise a rated voltage and a minimum calculated voltage, and calculating an adjustment coefficient of the transformer according to the voltage and electrical parameters of the transformer may comprise: if the voltage of the transformer is greater than or equal to the minimum calculated voltage and is smaller than or equal to the rated voltage, calculating the adjustment coefficient of the transformer according to a power function of the ratio of the voltage of the transformer to the rated voltage, wherein the power exponent of the power function is a real number greater than 1.

Furthermore, the electrical parameters of the transformer comprise the rated voltage and the minimum calculated voltage, and calculating an adjustment coefficient of the transformer according to the voltage and electrical parameters of the transformer may comprise: if the voltage of the transformer is greater than or equal to the minimum calculated voltage and is smaller than or equal to the rated voltage, calculating the adjustment coefficient of the transformer according to a power function of the ratio of the voltage of the transformer to the rated voltage, wherein the power exponent of the power function is a positive real number smaller than 1.

Furthermore, the electrical parameters of the transformer comprise the rated voltage and the minimum calculated voltage, and calculating an adjustment coefficient of the transformer according to the voltage and electrical parameters of the transformer may comprise: if the voltage of the transformer is greater than or equal to the minimum calculated voltage and is smaller than or equal to the rated voltage, calculating the adjustment coefficient of the transformer according to a linear function of the ratio of the voltage of the transformer to the rated voltage.

Furthermore, the electrical parameters of the transformer comprise the rated voltage and the minimum calculated voltage, and calculating an adjustment coefficient of the transformer according to the voltage and electrical parameters of the transformer may comprise: if the voltage of the transformer is greater than the rated voltage, setting the adjustment coefficient of the transformer as a fixed value; and if the voltage of the transformer is smaller than the minimum calculated voltage, setting the adjustment coefficient of the transformer as a fixed value.

Optionally, the method may further comprise: calculating a critical value of a secondary-side operating parameter of the longitudinal differential protection device coupled to the transformer according to the corrected parameter; acquiring the real-time secondary-side operating parameter of the longitudinal differential protection device; and determining whether a malfunction has happened to the transformer according to the real-time secondary-side operating parameter and the critical value.

Optionally, the transformer is a series transformer.

Optionally, the voltage of the transformer is a phase voltage or line voltage of grid-side windings of the transformer, or a phase voltage or line voltage of valve-side windings of the transformer.

Optionally, the electrical parameters of the transformer comprise a rated voltage and a rated capacity.

Optionally, the secondary-side operating parameter may be a differential current, a brake current or a brake threshold.

Optionally, the voltage of the transformer comprises a minimum phase voltage.

When the grid-side voltage of a transformer is smaller than the grid-side rated voltage of the transformer, the corrected parameter of the transformer can be obtained—according to the actual voltage and electrical parameters of the transformer in the aforementioned method; and then, the corrected parameter is used to determine whether a malfunction has happended to the transformer. Because the corrected parameter is smaller than the rated parameter when the voltage of the transformer is smaller than a rated value, using the method of the present application for malfunction judgment can obtain a higher sensitivity.

DETAILED DESCRIPTION OF EMBODIMENTS

A traditional longitudinal differential protection method typically includes the following steps: acquiring a real-time secondary-side operating parameter of a longitudinal differential protection device; and calculating according to the real-time secondary-side operating parameter and a rated parameter of a transformer to determine whether a malfunction has happened to the transformer.

Figure 1:
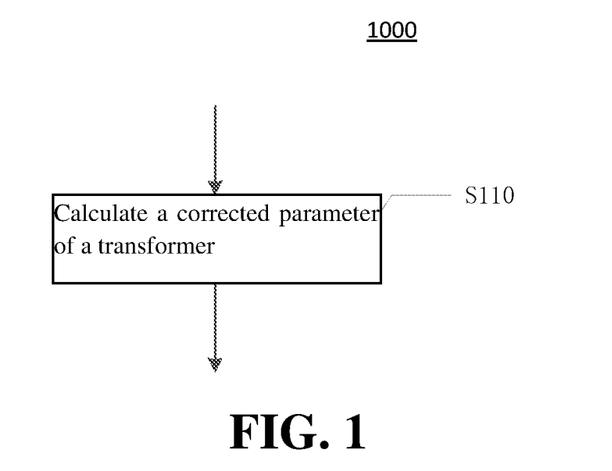
FIG. 1 is a flow diagram of a longitudinal differential protection method 1000 of a transformer according to one embodiment of the present application.

The present application discloses a longitudinal differential protection method 1000 of a transformer, which further includes, on the basis of the traditional longitudinal differential protection method, Step S110: a corrected parameter of a transformer is calculated according to a voltage and electrical parameters of the transformer.

Further, comparing the corrected parameter of the transformer obtained in Step S110 with the secondary-side operating parameter of the longitudinal differential protection device to determine whether a malfunction has happened to the transformer.

Optionally, Step S110 may further include the following steps:

Step S110A: an adjustment coefficient of the transformer is calculated according to the voltage and the electrical parameters of the transformer.

Step S110B: the corrected parameter of the transformer is calculated according to the adjustment coefficient and the electrical parameters of the transformer.

Further, Step S110A may include:

Step S110A1: if the voltage U of the transformer meets formula (1), the adjustment coefficient K of the transformer is calculated according to formula (2), wherein >1.

$$U_1 \leq U \leq U_n \qquad (1)$$

Wherein, $U_1$ is a minimum calculated voltage, and $U_n$ is a rated voltage.

$$K = U/U_n \qquad (2)$$

Or, Step S110A may also include Step S110A2: if the voltage U of the transformer meets formula (1), the adjustment coefficient K of the transformer is calculated according to formula (2), wherein 0<<1.

Or, Step S110A may also include Step S110A3: if the voltage U of the transformer meets formula (1), the adjustment coefficient K of the transformer is calculated according to formula (3).

$$K = \frac{1 - K_{min}}{U_n - U_p} U_p + K_{min} \qquad (3)$$

Wherein, $K_{min}$ is the value of the adjustment coefficient when $U_p$ is equal to $U_1$.

Further, the adjustment coefficient K can be calculated according to other linear functions.

Furthermore, in Step S110A, if $U > U_n$, the adjustment coefficient K of the transformer is a fixed value, such as 1. If $U < U_1$, the adjustment coefficient K of the transformer calculated according to the minimum calculated voltage $U_1$ and the rated voltage $U_n$ is a fixed value $K_{min}$. Furthermore, if $U_p = U_1$, the fixed value $K_{min}$ of the adjustment coefficient of the transformer can be calculated through Step S110A 1, Step S110A 2 and Steps S110A 3.

Optionally, the minimum calculated voltage $U_1$ may be zero.

Optionally, the method 1000 may further include Step S120 and Step S130A, wherein:

Step S120: the real-time secondary-side operating parameter of the longitudinal differential protection device coupled to the transformer is acquired.

Step S130A: the real-time secondary-side operating parameter and the corrected parameter of the transformer are used to determine whether a malfunction has happened to the transformer.

Furthermore, Step S130A may include Step S130 and Step S140.

Step S130: a critical value of a secondary-side operating parameter is calculated according to the corrected parameter.

Step S140: the real-time secondary-side operating parameter and the critical value of the secondary-side operating parameter are used to determine whether a malfunction has happened to the transformer.

Furthermore, Step S120 may be implemented before Step S110, or may be implemented between Step S130 and Step S140.

Optionally, the transformer mentioned in Step S110 may be a series transformer, which can be connected in series with a current converter or other devices and is configured in an application circuit.

Optionally, the transformer mentioned in Step S110 includes one set of grid-side windings or at least two sets of grid-side windings. Or, the transformer includes one set of valve-side windings or at least two sets of valve-side windings.

Figure 1A:
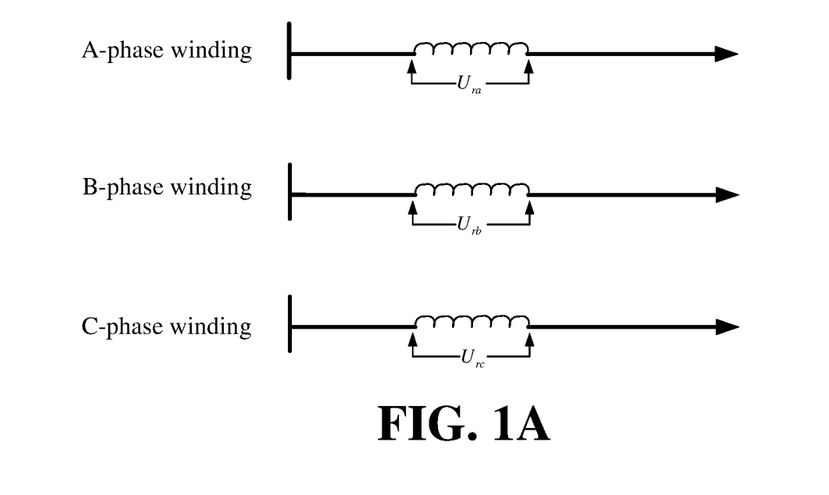
FIG. 1a is a schematic diagram of an electrical model of one set of windings of a transformer.

As shown in FIG. 1a which is a principle diagram of one set of windings of the transformer coupled to the longitudinal differential protection device. Wherein, the A-phase winding, the B-phase winding and the C-phase winding may be grid-side windings of the transformer or valve-side windings of the transformer. The A-phase winding, the B-phase winding and the C-phase winding may be connected in a delta shape or in a star shape.

Optionally, the voltage of the transformer mentioned in Step S110 may be a phase voltage or line voltage of the grid-side windings of the transformer, or a phase voltage or line voltage of the valve-side windings of the transformer. Further, the voltage of the transformer mentioned in Step S110 may be a calculated value of the above-mentioned voltage, such as a mean of effective values of three-phase voltages, a mini mum phase voltage of the three-phase voltages, or the like.

Optionally, the secondary-side operating parameter mentioned in Step S110 may be the current of a secondary side of the longitudinal differential protection device. Further, the secondary-side operating parameter may also be other real-time parameter of a secondary-side circuit, which can be used for calculating the current in the A-phase winding, the B-phase winding and the C-phase winding of the transformer, such as voltage, frequency and digital value of the secondary-side circuit. Furthermore, the secondary-side operating parameter may also be a calculated value, obtained based on the above-mentioned parameters, of some data relating to the A-phase winding, the B-phase winding and the C-phase winding, such as differential current, brake current, or brake threshold.

Furthermore, the critical value of the secondary-side operating parameter is a critical value of the aforesaid secondary-side operating parameter used for malfunction judgment under an actual operating voltage of the transformer, and can be obtained by calculating according to the corrected parameter of the transformer.

Optionally, the electrical parameters of the transformer mentioned in Step S110 may include rated voltage, rated capacity, rated current and other rated parameters of the transformer. Wherein, the rated voltage may be a rated phase voltage or a rated line voltage, and the rated current may be rated phase current or a rated line current. The rated voltage and the rated current may be relevant electrical parameters of a grid-side windings or relevant electrical parameters of a valve-side windings.

Furthermore, the electrical parameters of the transformer may include other parameters of the transformer used for calculating the critical value of the secondary-side operating parameter under the rated voltage, such as balance coefficient.

Optionally, the corrected parameter mentioned in Step S110 may be a corrected value of the electrical parameters of the transformer, for instance, the corrected parameter may be a capacity of the transformer, and the capacity is a corrected value of the rated capacity of the transformer. Furthermore, the corrected value may also be a corrected value of a parameter obtained by calculating according to the electrical parameters of the transformer, for instance, the corrected parameter is the critical value of the real-time secondary-side operating parameter mentioned in Step S120.

Furthermore, Step S110B may include: the corrected value of the electrical parameters of the transformer is calculated according to the adjustment coefficient and the electrical parameters of the transformer.

The electrical parameters used for calculation in Step S110 may include: rated capacity, rated voltage, rated current, balance coefficient, and the like. Or, the electrical parameters may include original value of a differential current and original value of a brake current obtained by calculating according to the above-mentioned electrical parameters.

When the grid-side voltage of the transformer is smaller than the grid-side rated voltage of the transformer, the corrected parameter of the transformer can be obtained through the aforementioned method, and the corrected parameter can be used to determine whether a malfunction has happened to the transformer. Because the corrected parameter is more sensitive than the rated value of the transformer, using the method of the present application for malfunction judgment can obtain a higher sensitivity.

Figure 5:
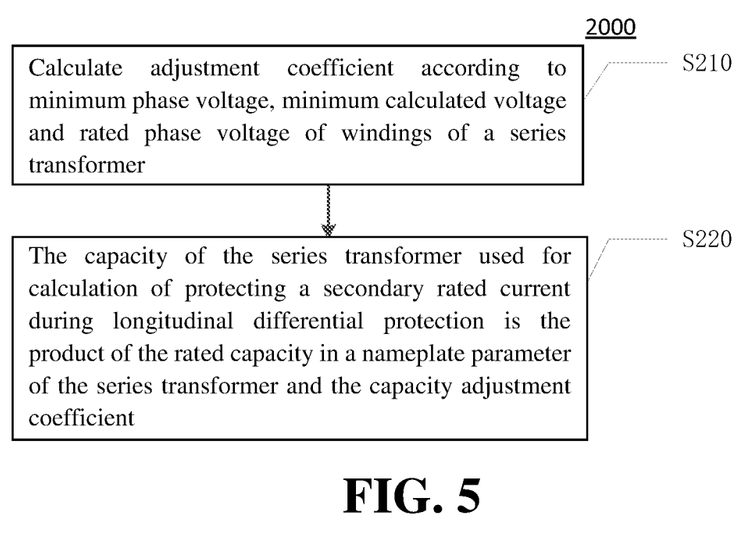
FIG. 5 is a flow diagram of a longitudinal differential protection method 2000 for a transformer according to another embodiment of the present application.

As shown in FIG. 5, the present application further discloses a longitudinal differential protection method 2000 of a transformer, which includes Step S120 and Step S220.

Step S210: an adjustment coefficient is calculated according to a minimum phase voltage $U_p$, a minimum calculated voltage $U_1$ and a rated phase voltage $U_n$ of windings of a series transformer.

Step S220: the capacity of the series transformer used for calculation of protecting a secondary rated current during longitudinal differential protection is the product of the rated capacity in a nameplate parameter of the series transformer and the capacity adjustment coefficient.

Wherein, Step S210 includes Steps S210A, Step S210B and Step S210C.

Step S210A: when the minimum phase voltage $U_p$ of the windings of the series transformer is greater than the rated phase voltage $U_n$, the capacity adjustment coefficient is set as 1.

Step S210B: when the minimum phase voltage $U_p$ of the windings of the series transformer is smaller than the set minimum calculated voltage $U_1$, the capacity adjustment coefficient is set as $K_{min}$, wherein the range of the minimum calculated voltage $U_1$ is $0<U_1<U_n$, and the range of $K_{min}$ is $0<K_{min}<1$.

Step S210C: when the minimum phase voltage $U_p$ of the windings of the series transformer is greater than the set minimum calculated voltage $U_1$ and smaller than the rated phase voltage $U_n$, the capacity adjustment coefficient linearly increases along with the increase of $U_p$, wherein a track of the value of the capacity adjustment coefficient is a line defined by the coordinates of two points, namely the coordinates of an initial point $(U_1, K_{min})$ and the coordinates of an endpoint $(U_n, 1)$.

The phase voltage of the windings of the series transformer is a grid-side winding voltage or a valve-side winding voltage.

FIG. 1a illustrates the winding phase voltage participating in calculation of the capacity adjustment coefficient of longitudinal differential protection of the series transformer. The minimum one of phase voltages of the A-phase winding, the B-phase winding and the C-phase winding of the series transformer is obtained and is compared with the rated phase voltage of the windings. The phase voltages of the A-phase winding, the B-phase winding and the C-phase winding of the series transformer may be grid-side winding voltages or valve-side winding voltages. The values of the phase voltages of the A-phase winding, the B-phase winding and the C-phase winding of the series transformer may be obtained at the moment when the current differential current of a relay protection device is calculated or before the moment when the current longitudinal differential is calculated. No matter which moment is chosen, the value points of the phase voltages on each side should guarantee that the phase voltages are on the same time section. When the phase voltages of the A-phase winding, the B-phase winding and the C-phase winding of the series transformer are compared with the rated voltage of the windings, if the phase voltages of the A-phase winding, the B-phase winding and the C-phase winding of the series transformer are obtained from the line side, the phase voltages of the A-phase winding, the B-phase winding and the C-phase winding of the series transformer will be compared with the grid-side rated voltage of the series transformer; or, if the phase voltages of the A-phase winding, the B-phase winding and the C-phase winding of the series transformer are obtained from the valve side, the phase voltages of the A-phase winding, the B-phase winding and the C-phase winding of the series transformer will be compared with the valve-side rated voltage of the series transformer.

When the minimum phase voltage $U_p$ of the windings of the series transformer is greater than the rated phase voltage $U_n$, the capacity adjustment coefficient is set as 1.

When the minimum phase voltage $U_p$ of the windings of the series transformer is smaller than the minimum calculated voltage $U_1$, the capacity adjustment coefficient is set as $K_{min}$. The range of the minimum calculated voltage $U_1$ is $0<U_1<U_n$.

Figure 2:
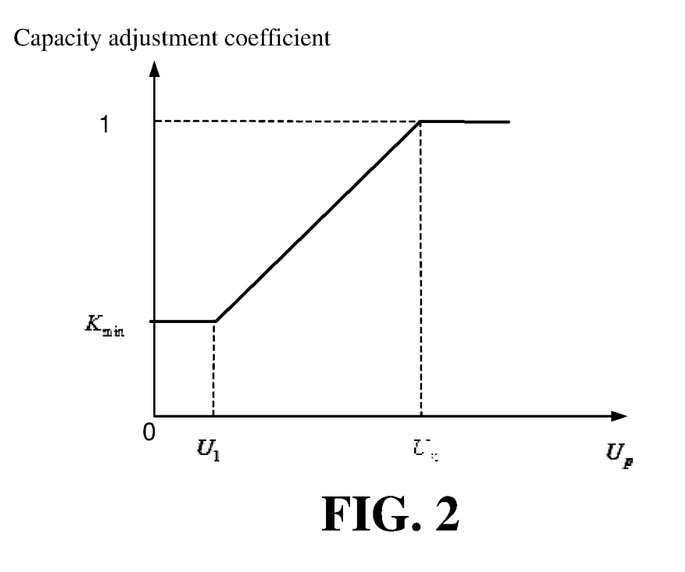
FIG. 2 is a variation curve chart of an adjustment coefficient.

When the minimum phase voltage $U_p$ of the windings of the series transformer is greater than the minimum calculated voltage and smaller than the rated phase voltage, the capacity adjustment coefficient linearly increases along with the increase of $U_p$. A track of the value of the capacity adjustment coefficient is a line defined by the coordinates of two points, namely the coordinates of an initial point $(U_1, K_{min})$ and the coordinates of an endpoint $(U_n, 1)$. FIG. 2 illustrates a variation curve of the adjustment coefficient for longitudinal differential protection of the series transformer.

When the series transformer operates normally, the minimum phase voltage $U_p$ of the windings is smaller than the rated phase voltage $U_n$ of the windings. Hence, the calculated value, obtained after adjustment by the method of the present application, of the secondary rated current on each side of the series transformer is smaller than the calculated value, obtained by the conventional calculation method, of the secondary rated current on each side of the transformer, so that a calculated value of the differential current for longitudinal differential protection is amplified to ensure that the longitudinal differential protection can better adapt to the characteristics of calculation points of internal and external malfunctions, thus improving the sensitivity of the longitudinal differential protection.

Figure 6:
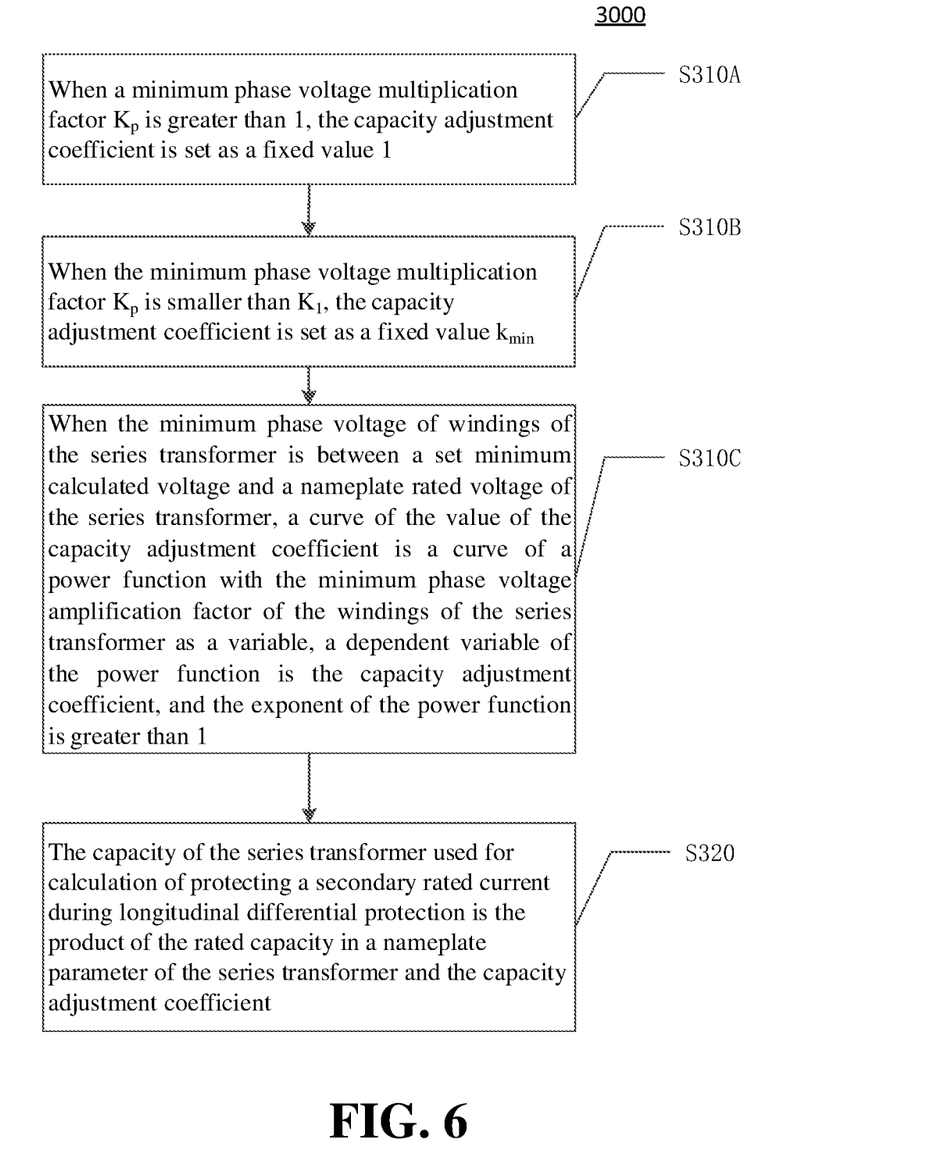
FIG. 6 is a flow diagram of a longitudinal differential protection method 3000 for a transformer according to yet another embodiment of the present application.

As shown in FIG. 6, the present application discloses a longitudinal differential protection method 3000 of a transformer. The method 3000 includes Step S310A, Step S310B, Step 310C and Step S320, wherein Step S310A, Step S310B and Step S320 are similar to the corresponding steps of method 2000 and will not be repeated herein.

Step S310C: when the minimum phase voltage $U_p$ of the windings of the series transformer is between the set minimum calculated voltage $U_1$ and a nameplate rated phase voltage $U_n$ of the series transformer, a curve of the value of the capacity adjustment coefficient is a curve of a power function with a minimum phase voltage multiplication factor $k_p$ of the windings of the series transformer as an independent variable, a dependent variable of the power function is the capacity adjustment coefficient, and the exponent of the power function is greater than 1; wherein $k_p$ is a ratio of the minimum phase voltage $U_p$ of the windings of the series transformer to the nameplate rated phase voltage $U_n$ of the series transformer.

Figure 3:
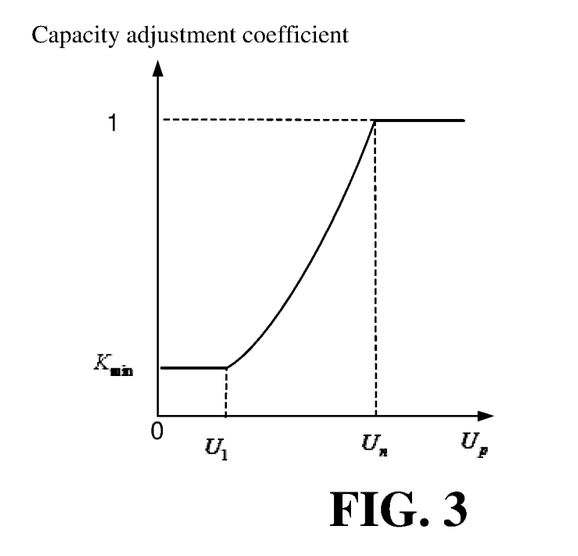
FIG. 3 is another variation curve chart of the adjustment coefficient.

In method 3000, a variation curve of the adjustment coefficient is shown in FIG. 3.

When the series transformer operates normally, the minimum phase voltage $U_p$ of the windings is smaller than the rated phase voltage $U_n$ of the windings. Hence, the capacity of the transformer obtained after adjustment by the method of the present application is less than the rated capacity, and the calculated value of the secondary rated current on each side of the series transformer is smaller than the calculated value, obtained by calculating according to the rated capacity, of the secondary rated current on each side of the transformer, so that a calculated value of the differential current for longitudinal differential protection is amplified. Meanwhile, he capacity adjustment coefficient is in an exponential relationship with the minimum phase voltage multiplication factor of the windings of the series transformer, so that the capacity adjustment speed for longitudinal differential calculation of the series transformer is increased in a transient state to ensure that the longitudinal differential protection can better adapt to the characteristics of calculation points of internal and external faults, thus improving the sensitivity of the longitudinal differential protection.

Figure 7:
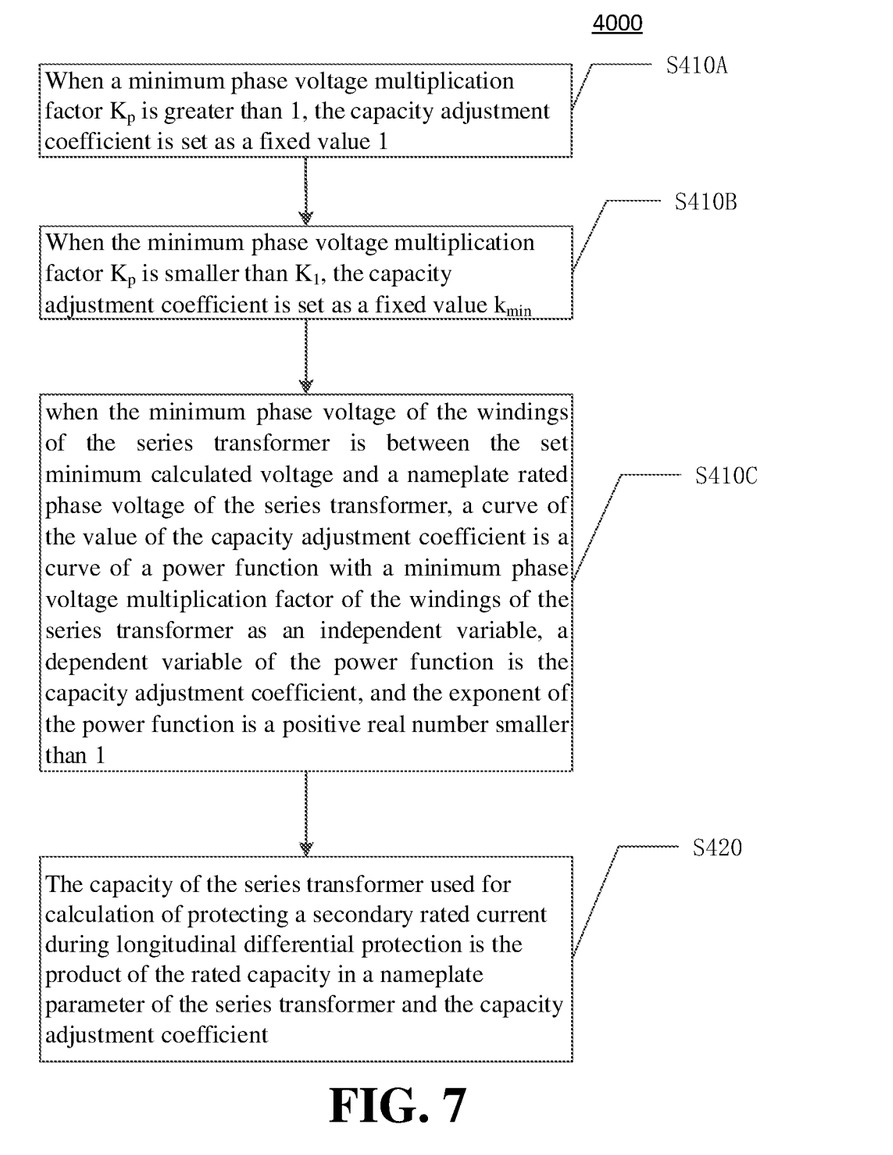
FIG. 7 is a flow diagram of a longitudinal differential protection method 4000 for a transformer according to still another embodiment of the present application.

As shown in FIG. 7, the present application discloses a longitudinal differential protection method 4000 of a transformer. The method 4000 includes Step S410A, Step S410B, Step S410C and Step S420, wherein Step S410A, Step S410B and Step S420 are similar to the corresponding steps of method 2000 and will not be repeated herein.

Step S410C: when the minimum phase voltage $U_p$ of the windings of the series transformer is between the minimum calculated voltage $U_1$ and the nameplate rated phase voltage $U_n$ of the series transformer, the value of the capacity adjustment coefficient k meets formula: $k=k_p$, wherein meets $0\ll 1$. Wherein, $k_p$ is the ratio of the minimum phase voltage $U_p$ of the windings of the series transformer to the rated phase voltage $U_n$ of the transformer.

Figure 4:
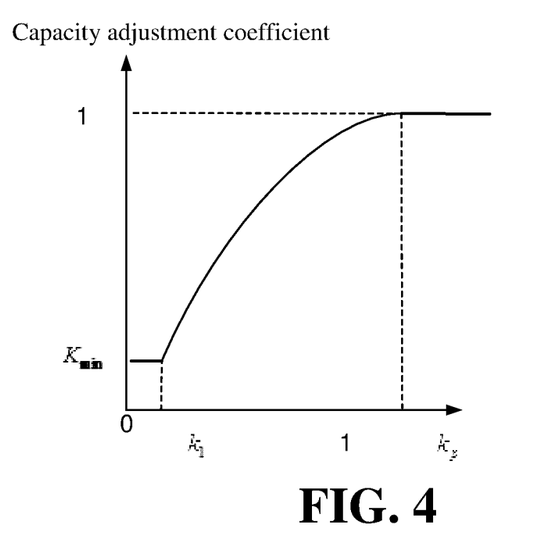
FIG. 4 is yet another variation curve chart of the adjustment coefficient.

In the method 4000, a variation curve of the adjustment coefficient is shown in FIG. 4.

When the series transformer operates normally, the minimum phase voltage $U_p$ of the windings is smaller than the rated phase voltage $U_n$ of the windings. Hence, the capacity of the transformer obtained after adjustment by the method of the present application is less than the rated capacity, and the calculated value of the secondary rated current on each side of the series transformer is smaller than the calculated value, obtained by calculating according to the rated capacity, of the secondary rated current on each side of the transformer, so that a calculated value of the differential current for longitudinal differential protection is amplified. Meanwhile, when the minimum phase voltage of the windings of the series transformer varies rapidly, the variation amplitude of the capacity adjustment coefficient is small, so that the transient-state brake characteristics of longitudinal differential protection is improved.

The present application further discloses the following solutions:

Solution 1: A longitudinal differential protection method of a series transformer, wherein the capacity of the series transformer used for calculation of protecting a secondary rated current during longitudinal differential protection is the product of the rated capacity in a nameplate parameter of the series transformer and the capacity adjustment coefficient, wherein the capacity adjustment coefficient is determined according to the relationship between phase voltages of windings of the series transformer and a rated phase voltage.

Solution 2: on the basis of Solution 1, wherein: when a minimum phase voltage $U_p$ of the windings of the series transformer is greater than the rated phase voltage $U_n$, the capacity adjustment coefficient is set as 1.

Solution 3: on the basis of Solution 1, wherein: when the minimum phase voltage $U_p$ of the windings of the series transformer is smaller than a set minimum calculated voltage $U_1$, the capacity adjustment coefficient is set as $K_{min}$; the range of the minimum calculated voltage $U_1$ meets: $0<U_1<U_n$; and the range of $K_{min}$ meets $0<K_{min}<1$.

Solution 4: on the basis of Solution 1, wherein: when the minimum phase voltage $U_p$ of the windings of the series transformer is greater than the set minimum calculated voltage $U_1$ and smaller than the rated phase voltage $U_n$, the capacity adjustment coefficient linearly increases along with the increase of $U_p$; a track of the value of the capacity adjustment capacity is a line defined by the coordinates of two points, namely the coordinates of an initial point $(U_1, K_{min})$ and the coordinates of an endpoint $(U_n, 1)$.

Solution 5: on the basis of Solution 1, wherein: the phase voltage of the windings of the series transformer is a grid-side winding voltage or a valve-side winding voltage.

Solution 6: A longitudinal differential protection method of a series transformer, wherein the capacity of the series transformer used for calculation of protecting a secondary rated current during longitudinal differential protection is the product of the rated capacity in a nameplate parameter of the series transformer and the capacity adjustment coefficient, wherein the capacity adjustment coefficient is determined according to the relationship between the phase voltages of windings of the series transformer and a rated phase voltage; when a minimum phase voltage $U_p$ of the windings of the series transformer is set between a set minimum calculated voltage $U_1$ and the nameplate rated phase voltage $U_n$ of the series transformer, a value curve of the capacity adjustment coefficient is the curve of a power function with the a minimum phase voltage multiplication factor $k_p$ of the windings of the series transformer as an independent variable, a dependent variable of the power function is the capacity adjustment coefficient, and the exponent of the power function is greater than 1; wherein, $k_p$ is the ratio of the minimum phase voltage $U_p$ of the windings of the series transformer to the nameplate rate phase voltage $U_n$ of the series transformer.

Solution 7: on the basis of Solution 6, wherein: when the minimum phase voltage multiplication factor $k_p$ is smaller than $k_1$, the capacity adjustment coefficient is set as a fixed value $K_{min}$; wherein, the value range of $K_{min}$ is $(0,1)$, $k_1$ is the ratio of the minimum calculated voltage $U_1$ to the nameplate rated voltage $U_n$ of the windings of the transformer, and the value range of $U_1$ is $(0, U_n)$; when the minimum phase voltage multiplication factor $k_p$ is greater than 1, the capacity adjustment coefficient is set as a fixed value 1.

Solution 8: on the basis of Solution 6, wherein: the phase voltage of the windings of the series transformer is a grid-side winding voltage or a valve-side winding voltage.

Solution 9: A longitudinal differential protection method for a series transformer, wherein the capacity of the series transformer used for calculation of protecting a secondary rated current during longitudinal differential protection is the product of the rated capacity in a nameplate parameter of the series transformer and the capacity adjustment coefficient; and the capacity adjustment coefficient k does not linearly change along with the changes of the minimum phase voltage multiplication factor $k_p$; wherein, $k_p$ is the ratio of the minimum phase voltage $U_p$ of the windings of the series transformer to the rated phase voltage $U_n$ of the transformer.

Solution 10: on the basis of Solution 9, wherein: when the minimum phase voltage $U_p$ of the windings of the series transformer is between the minimum calculated voltage $U_1$ and the nameplate rated phase voltage $U_n$ of the windings of the series transformer, the value of the capacity adjustment coefficient k meets formula: $k=k_p$, and meets $0<<1$.

Solution 11: on the basis of Solution 9, wherein: when the minimum phase voltage multiplication factor $k_p$ is smaller than $k_1$, the capacity adjustment coefficient is set as a fixed value $K_{min}$; wherein, the value range of $K_{min}$ is $(0,1)$, $k_1$ is the ratio of the minimum calculated voltage $U_1$ to the nameplate rated voltage $U_n$ of the windings of the transformer, and the value range of $U_1$ is $(0, U_n)$; when the minimum phase voltage multiplication factor $k_p$ is greater than 1, the capacity adjustment coefficient is set as a fixed value 1.

Solution 12: on the basis of Solution 9, wherein: the minimum phase voltage of the windings of the series transformer is a grid-side winding voltage or a valve-side winding voltage.

What is claimed is:

1. A method of longitudinal differential protection for detecting malfunction for a transformer using a longitudinal differential protection device coupled to the transformer, the method comprising:

determining, by a processor, a corrected parameter of a transformer according to a voltage and electrical parameters of the transformer, wherein the electrical parameters of the transformer comprise a rated capacity of the transformer, and the corrected parameter of the transformer comprises a capacity of the transformer;

determining, by the processor, a threshold value of a secondary-side operating parameter of a longitudinal differential protection device coupled to the transformer according to the corrected parameter;

acquiring, by the processor, a real-time secondary-side operating parameter of the longitudinal differential protection device; and determining, by the processor, whether a malfunction has occurred to the transformer according to the real-time secondary-side operating parameter and the threshold value.

2. The method according to claim 1, wherein calculating, by the processor, the corrected parameter of the transformer according to the voltage and the electrical parameters of the transformer comprises:

determining, by the processor, an adjustment coefficient of the transformer according to the voltage and the electrical parameters of the transformer, wherein the adjustment coefficient is used for adjusting the capacity of the transformer; and determining, by the processor, the corrected parameter according to the adjustment coefficient and the electrical parameters of the transformer.

3. The method according to claim 1, wherein the transformer is a series transformer.

4. The method according to claim 1, wherein the voltage of the transformer is a phase voltage or line voltage of grid-side windings of the transformer, or a phase voltage or line voltage of valve-side windings of the transformer.

5. The method according to claim 1, wherein the secondary-side operating parameter is a differential current, a brake current or a brake threshold.

6. The method according to claim 1, wherein the voltage of the transformer is a minimum phase voltage.

7. The method according to claim 2, wherein the electrical parameters of the transformer comprise a rated voltage and a minimum calculated voltage; and determining, by the processor, the adjustment coefficient of the transformer according to the voltage and the electrical parameters of the transformer comprises:

based on a determination that the voltage of the transformer is greater than or equal to the minimum calculated voltage and is smaller than or equal to the rated voltage, calculating the adjustment coefficient of the transformer according to a power function of a ratio of the voltage of the transformer to the rated voltage, wherein a power exponent of the power function is a real number greater than 1.

8. The method according to claim 2, wherein the electrical parameters of the transformer comprise a rated voltage and a minimum calculated voltage; and determining, by the processor, the adjustment coefficient of the transformer according to the voltage and the electrical parameters of the transformer comprises:

based on a determination that the voltage of the transformer is greater than or equal to the minimum calculated voltage and is smaller than or equal to the rated voltage, determining, by the processor, the adjustment coefficient of the transformer according to a power function of a ratio of the voltage of the transformer to the rated voltage, wherein a power exponent of the power function is a positive real number smaller than 1.

9. The method according to claim 2, wherein the electrical parameters of the transformer comprise a rated voltage and a minimum calculated voltage; and determining, by the processor, the adjustment coefficient of the transformer according to the voltage and the electrical parameters of the transformer comprises:

based on a determination that the voltage of the transformer is greater than or equal to the minimum calculated voltage and is smaller than or equal to the rated voltage, determining, by the processor, the adjustment coefficient of the transformer according to a linear function of a ratio of the voltage of the transformer to the rated voltage.

10. The method according to claim 2, wherein the electrical parameters of the transformer comprise a rated voltage and a minimum calculated voltage; and determining, by the processor, the adjustment coefficient of the transformer according to the voltage and electrical parameters of the transformer comprises:

based on a determination that the voltage of the transformer is greater than the rated voltage, setting, by the processor, the adjustment coefficient of the transformer as a first fixed value; and based on a determination that the voltage of the transformer is smaller than the minimum calculated voltage, setting, by the processor, the adjustment coefficient of the transformer as a second fixed value.

11. The method according to claim 3, wherein the capacity of the series transformer used for determining protection of a secondary rated current during longitudinal differential protection is a product of the rated capacity in a nameplate parameter of the series transformer and an adjustment coefficient for adjusting the capacity of the transformer, wherein the adjustment coefficient for adjusting the capacity of the transformer is determined according to a relationship between phase voltages of windings of the series transformer and a rated phase voltage.

* * * * *